United States Patent
Wu et al.

(10) Patent No.: US 7,558,124 B2
(45) Date of Patent: Jul. 7, 2009

(54) MEMORY INTERFACE TO BRIDGE MEMORY BUSES

(75) Inventors: Larry Wu, Shanghai (CN); Gang Shan, Shanghai (CN); Stephen Tai, Shanghai (CN); Howard Yang, Shanghai (CN); Zhen-Dong Guo, Shanghai (CN)

(73) Assignee: Montage Technology Group, Ltd, Tortola (VG)

( * ) Notice: Subject to any disclaimer, the term of this patent is extended or adjusted under 35 U.S.C. 154(b) by 264 days.

(21) Appl. No.: 11/277,650

(22) Filed: Mar. 28, 2006

(65) Prior Publication Data

US 2007/0121389 A1  May 31, 2007

Related U.S. Application Data

(63) Continuation-in-part of application No. 11/281,211, filed on Nov. 16, 2005, now Pat. No. 7,368,950.

(51) Int. Cl.
*G11C 7/10* (2006.01)
(52) U.S. Cl. ............... 365/189.05; 365/51; 365/189.17; 365/233.13
(58) Field of Classification Search ............ 365/189.05, 365/189.02, 189.17, 51, 233.13; 710/305, 710/306, 310
See application file for complete search history.

(56) References Cited

U.S. PATENT DOCUMENTS

| | | | |
|---|---|---|---|
| 5,032,744 A | 7/1991 | Wai Yeung Liu | |
| 5,430,859 A * | 7/1995 | Norman et al. | 711/103 |
| 5,977,819 A | 11/1999 | Sanwo | |
| 5,990,722 A | 11/1999 | Jaffard et al. | |
| 6,157,231 A | 12/2000 | Wasson | |
| 6,317,352 B1 | 11/2001 | Harbert et al. | |
| 6,820,163 B1 * | 11/2004 | McCall et al. | 710/310 |
| 6,830,470 B1 * | 12/2004 | Lynch et al. | 439/326 |
| 7,145,359 B2 | 12/2006 | Hein et al. | |
| 7,180,332 B2 | 2/2007 | DiGregorio | |
| 2004/0136411 A1 | 7/2004 | Hornbuckle et al. | |
| 2005/0138267 A1 * | 6/2005 | Bains et al. | 711/100 |
| 2006/0095620 A1 * | 5/2006 | Dreps et al. | 710/100 |
| 2006/0140317 A1 | 6/2006 | DiGregorio | |
| 2006/0195631 A1 * | 8/2006 | Rajamani | 710/51 |
| 2007/0160053 A1 * | 7/2007 | Coteus et al. | 370/394 |
| 2008/0031030 A1 * | 2/2008 | Rajan et al. | 365/63 |
| 2008/0052462 A1 * | 2/2008 | Blakely et al. | 711/115 |

OTHER PUBLICATIONS

JEDEC JESD82-20 Standard, "FBDIMM: Advanced Memory Buffer (AMB)," Mar. 2007. pp. 1-190.*
JEDEC JESD205 Standard, "FBDIMM Specification: DDR2 SDRAM Fully Buffered DIMM (FBDIMM) Design Specification," Mar. 2007. pp. 1-129.*

(Continued)

*Primary Examiner*—Pho M. Luu
*Assistant Examiner*—Alexander Sofocleous
(74) *Attorney, Agent, or Firm*—Ivy Y. Mei

(57) ABSTRACT

A memory interface to bridge a parallel memory bus and a serial memory bus. A printed circuit board includes at least one memory interface buffer chip to connect a memory controller of core logic and an advanced memory buffer (AMB). The memory controller has a memory interface for a parallel memory bus.

20 Claims, 11 Drawing Sheets

OTHER PUBLICATIONS

Kim et al., "Adaptive Supply Serial Links with Sub-1V Operation and Per-Pin Clock Recovery," IEEE Journal of Solid-State Circuits, Nov. 2002, vol. 37, No. 11, pp. 1403-1413.*

Kim et al., "Adaptive Supply Serial Links with Sub-1V Operation and Per-Pin Clock Recovery," IEEE International Solid-State Circuits Conference, Published 2002, Session 16, pp. 216-217 and 480.*

Sidiropoulos et al., "A Semidigital Dual Delay-Locked Loop," IEEE Journal of Solid-State Circuits, Nov. 1997, vol. 32, No. 11, pp. 1683-1692.*

Fiedler et al., "A 1.0625Gbps Transceiver with 2x-Oversampling and Transmit Signal Pre-Emphasis," IEEE International Solid-State Circuits Conference, Published 1997, Session 15, pp. 238-239 and 464.*

Yuan et al., "New Single-Clock CMOS Latches and Flipflops with Improved Speed and Power Savings," IEEE Journal of Solid-State Circuits, Jan. 1997, vol. 32, No. 1, pp. 62-69.*

Rau et al., "Clock/Data Recovery PLL Using Half-Frequency Clock," IEEE Journal of Solid-State Circuits, Jul. 1997, vol. 32, No. 7, pp. 1156-1159.*

* cited by examiner (a)

(b)

US 7,558,124 B2

MEMORY INTERFACE TO BRIDGE MEMORY BUSES

CROSS REFERENCE TO RELATED APPLICATION

This application is a continuation of U.S. patent application Ser. No. 11/281,211, filed Nov. 16, 2005, which is incorporated herein in its entirety by this reference made thereto for all purposes.

FIELD OF THE TECHNOLOGY

At least some embodiments of the invention relate to memory systems, and more specifically but not exclusively to memory systems with fully buffered memory modules.

BACKGROUND

Conventional memory systems use un-buffered or registered DIMMs that are connected by means of a stub bus, in which the memory modules are connected to a single channel. When the number of modules in the channel increases, the channel performance decreases and thus limits the performance of the memory system.

To increase the performance of the dynamic random access memory (DRAM) system of a computer system, the technology of Fully Buffered Dual In-line Memory Module (FB-DIMM) has been developed.

FB-DIMM technology uses high-speed, serial, point-to-point connections between memory modules and the memory controller. The host memory controller is connected to a first memory module; and a first memory module is connected to a second memory module; etc. Thus, the load of each link is constant. No branch is needed in this type of point-to-point connection. The memory modules operate at a constant load environment regardless of the number of memory modules used in the system.

Advanced Memory Buffer (AMB) is a portion of a FB-DIMM which provides the point-to-point link in the memory system. Typically, each FB-DIMM has an advanced memory buffer (AMB), which handles FB-DIMM channel and memory requests to and from the local FB-DIMM and forwards the requests to other FB-DIMMs. Such architecture can be used to design large-capacity and high-bandwidth memory subsystems for servers and workstations.

An AMB typically includes two serial ports and a parallel port. One of the serial port is for connecting to the host memory controller or the AMB of the adjacent memory module that is closer to the host memory controller; the other serial port is for connecting to the AMB of the adjacent memory module that is further away from the host memory controller; and the parallel port is for connecting to the bus to the memory chips that are on the same memory module as the AMB.

For example, serial data from the host memory controller sent through a downstream serial link to the AMB is temporarily buffered in the AMB before being sent to the DRAM chips on the memory module. The serial data contains the address, data and command information, which is converted to parallel data in the AMB and placed onto the DRAM bus on the memory module. The AMB writes in and reads out from DRAM chips as instructed by the memory controller. The data retrieved from the DRAM is converted to serial data in the AMB and sent to the memory controller through an upstream serial link.

SUMMARY OF THE DESCRIPTION

A memory interface to bridge a parallel memory bus and a serial memory bus is described herein. Some embodiments of the invention are summarized in this section.

The invention provides a printed circuit board includes at least one memory interface buffer chip to connect a memory controller of core logic and an advanced memory buffer (AMB). The printed circuit board further includes a plurality of memory sockets configured to accept one or more fully buffered memory modules; a chipset comprising the memory controller; and a central processing unit (CPU) socket coupled to the chipset to accept a microprocessor chip.

In addition, the printed circuit board further includes an advanced memory buffer (AMB) and a plurality of memory chips under the control of the advanced memory buffer.

The printed circuit board further provides a form factor suitable for insertion into a memory socket on a motherboard.

The invention provides a computer system that includes a microprocessor chip; a core logic chip coupled to the microprocessor chip, the core logic chip comprising a memory controller; one or more fully buffered dual in-line memory modules; and a memory interface buffer chip coupled between the memory controller and the one or more fully buffered dual in-line memory modules. The memory controller of computer system accesses memory via a parallel memory bus.

The computer system further includes one or more further buffered dual in-line memory modules; and a further memory buffer chip coupled between the memory controller and the one or more further fully buffered dual in-line memory modules.

The computer system further includes a printed circuit board; wherein the microprocessor chip, the core logic chip, the one or more fully buffered dual in-line memory modules and the memory interface buffer chip are mounted on the printed circuit board.

The present invention provides a circuit that includes a transceiver to bridge a parallel memory bus and a serial memory bus; and a protocol converter coupled to the transceiver to translate control signals received from a memory controller of the parallel memory bus to control signals for the serial memory bus.

In one embodiment of the present invention, the serial memory bus of the circuit is in accordance with a Joint Electron Device Engineering Council (JEDEC) Advanced Memory Buffer (AMB) specification.

In one embodiment of the present invention, the circuit is implemented on a single integrated circuit chip. The serial memory bus is connected to an Advanced Memory Buffer (AMB) of a fully buffered dual in-line memory module.

In one embodiment of the present invention, the parallel memory bus of the circuit is connected to a memory controller of core logic on a motherboard.

In one embodiment of the present invention, the parallel memory bus of the circuit is connected to a memory controller of a northbridge chip.

The invention provides a transceiver including a pseudo differential digital logic circuit to convert an input to the transceiver into a differential digital output.

In one embodiment of the present invention, the pseudo differential digital logic circuit is implemented using Complementary Metal-Oxide Semiconductor (CMOS).

The invention provides a circuit that further including an adaptive power-supply regulator coupled with the pseudo differential digital logic circuit to adaptively adjust a power supply of the pseudo differential digital logic circuit.

In one embodiment of the present invention, the pseudo differential digital logic circuit includes two logic units each of which is one of: a buffer and an inverter; and a common mode feedback (CMFB) circuit coupled to the two logic units, the CMFB circuit to receive outputs of the two logic units and adjust the two logic units according to a common mode detected from the outputs of the two logic units to suppress command mode.

In one embodiment of the present invention, the pseudo differential digital logic circuit includes two logic units each of which is one of: a buffer and an inverter; and a cross couple circuit coupled to the two logic units, the cross couple circuit to cross couple outputs of the two logic units to suppress command mode in the outputs of the two logic units.

In one embodiment of the present invention, the pseudo differential digital logic circuit includes two logic units each of which is one of: a buffer and an inverter; and a clock synchronization circuit coupled to the two logic units to synchronize timing of outputs of the two logic units.

The present invention includes methods and apparatuses which perform these methods, including data processing systems which perform these methods, and computer readable media which when executed on data processing systems cause the systems to perform these methods.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings in which like references indicate similar elements.

DETAILED DESCRIPTION OF THE INVENTION

The following description and drawings are illustrative of the invention and are not to be construed as limiting the invention. Numerous specific details are described to provide a thorough understanding of the present invention. However, in certain instances, well-known or conventional details are not described in order to avoid obscuring the description of the present invention. References to one or an embodiment in the present disclosure are not necessarily references to the same embodiment; and, such references mean at least one.

Fully Buffered-Dual-in-line Memory Modules (FB-DIMMs) are being developed to meet the increasing demand of memory capacity and bandwidth. FB-DIMM technology uses a memory controller that has an AMB interface to access FB-DIMMs. However, many current available memory controllers are capable of connecting to the conventional unbuffered or registered Dual Inline Memory Modules (DIMMs) but not to the FB-DIMMs, because of the lack of an AMB interface.

One embodiment of the invention provides a memory system architecture with a buffer on the circuit board, which may be called buffer on board, to enable the connection between a memory controller without an Advanced Memory Buffer (AMB) interface and FB-DIMMs. Thus, a conventional memory controller which lacks an AMB interface may be used with FB-DIMMs via a buffer on board. Further, the use of buffers on board according to embodiments of the invention allows the flexibility to design various hybrid memory systems.

Figure 1:
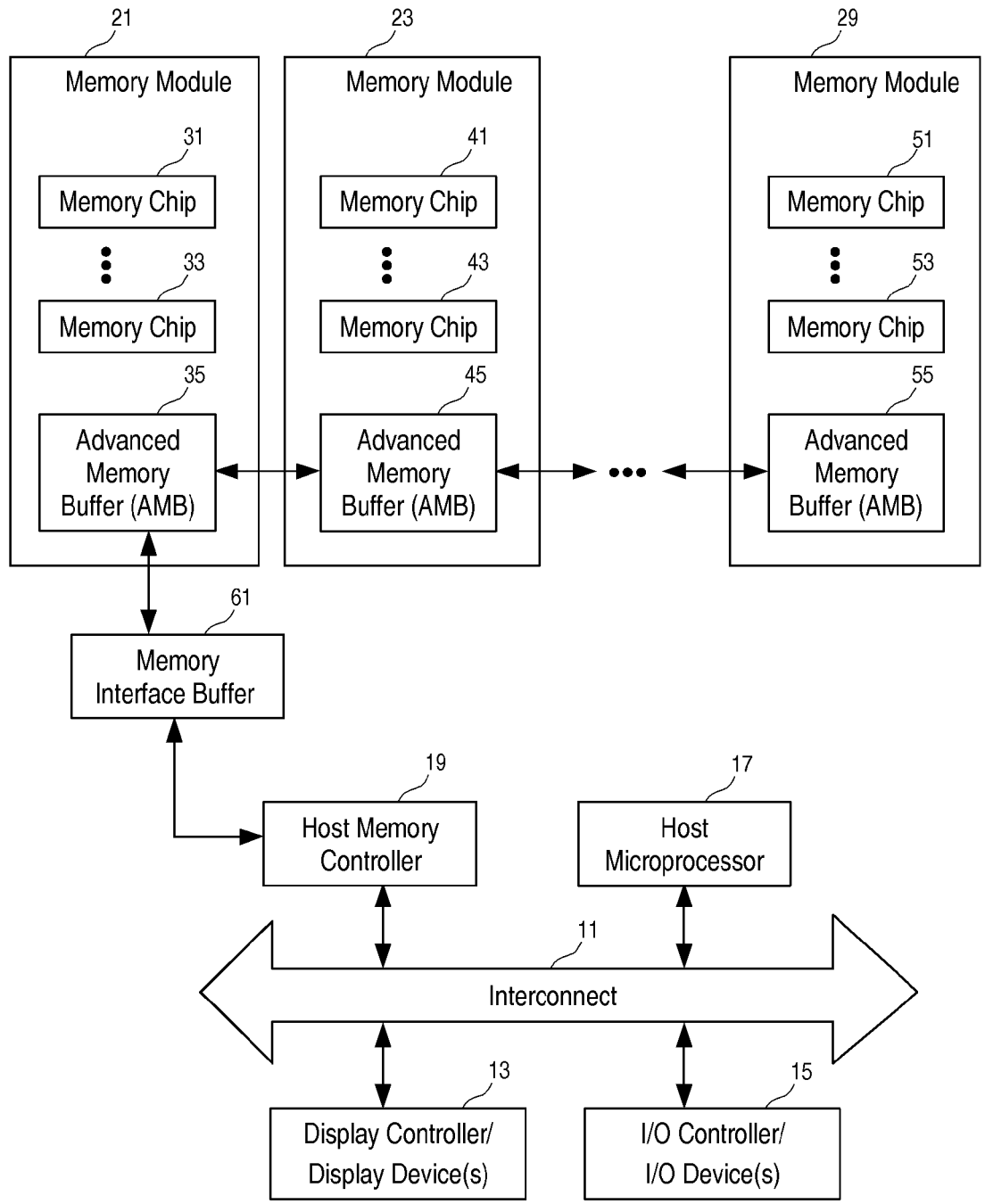
FIG. 1 shows a computer using a memory system according to one embodiment of the invention.

FIG. 1 shows a computer using a memory system according to one embodiment of the invention.

In FIG. 1, a system includes a number of memory modules (21, 23, . . . , 29). Each of the memory modules (21, 23, . . . , 29) includes a number of memory chips. For example, the memory module (21) has memory chips (31, . . . , 33); the memory module (23) has memory chips (41, . . . , 43); and the memory module (29) has memory chips (51, . . . , 53).

In FIG. 1, the memory modules (21, 23, . . . , 29) are configured into a chain through point-to-point connections between advanced memory buffers (35, 45, . . . , 55). The chain of memory modules (21, 23, . . . , 29) are connected to the host memory controller (19) via memory interface buffer (61). The host memory controller (19) is typically implemented on a chipset (e.g., northbridge chip), which provides connections between the memory and the host processor (17).

In one embodiment, the memory interface buffer (61) is not part of an integrated circuit chip that contains the host memory controller (19). In one embodiment, the memory interface buffer (61) and the host memory controller (19) are integrated on two different integrated circuit chips for a flexible memory system. In one embodiment, the memory interface buffer is implemented on an integrated circuit chip and installed on a printed circuit board as a buffer on board.

In FIG. 1, the host microprocessor (17) and the host memory controller (19) are typically on different Integrated Circuit chips, although they may be implemented on the same chip. The host memory controller (19) is coupled to the host microprocessor (17) through an interconnect (11), which may include a bus, a chipset for core logic, a high-speed serial/parallel link, etc.

In FIG. 1, the display controller/display device(s) (13) and the I/O controllers/I/O device(s) (15) are also coupled to the host microprocessor (17) through the interconnect (11).

In one embodiment, the connection between the memory interface buffer (61) and the host memory controller (19) is a conventional parallel connection, such that a conventional host memory controller (19) can be used with fully buffer memory modules (e.g., 21, 23, . . . , 29), which uses point-to-point, serial connections to connect each other into a chain.

Figure 2:
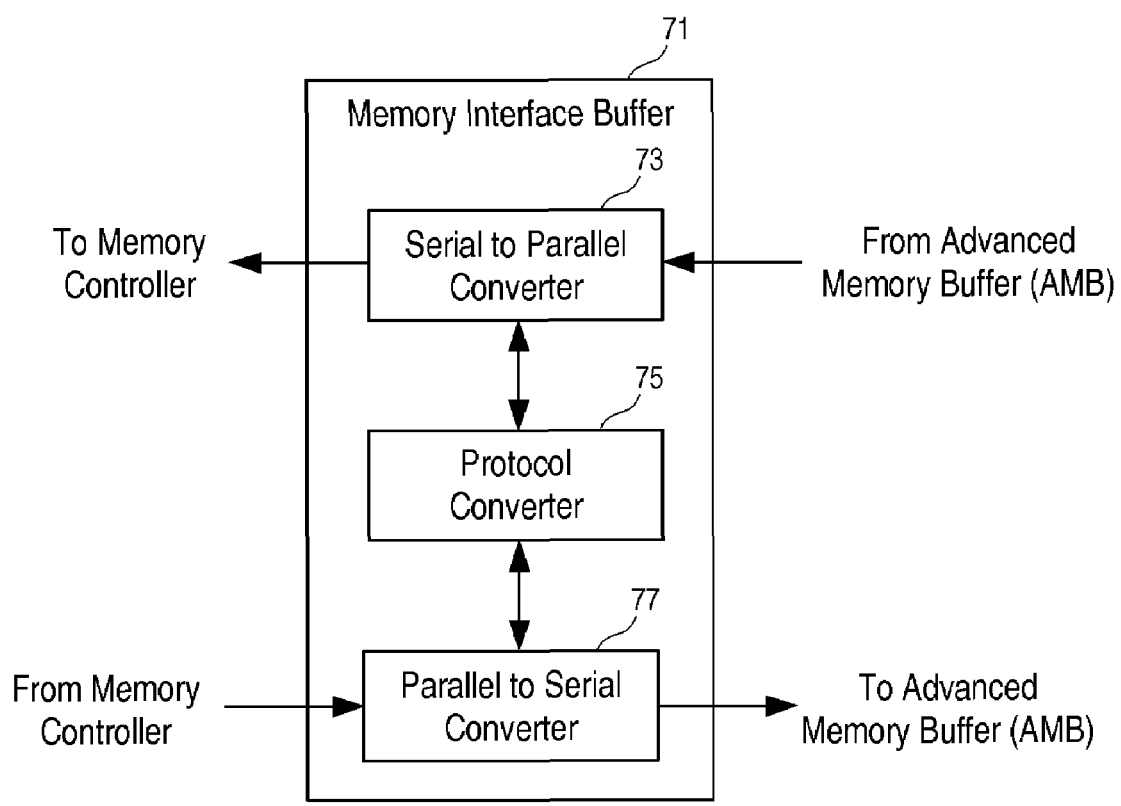
FIG. 2 shows a block diagram of a memory interface buffer according to one embodiment of the invention.

FIG. 2 shows a block diagram of a memory interface buffer according to one embodiment of the invention. In FIG. 2, a memory interface buffer (71) includes a serial to parallel converter (73) to convert serial signals from an advanced memory buffer (AMB) into parallel signals to memory controller; and a parallel to serial converter (77) to convert parallel signals from memory controller into serial signals to the memory buffer (AMB).

In FIG. 2, a protocol converter (75) is used to forward the parallel signals received from the memory controller to the advanced memory buffer according to the serial protocol of the advanced memory buffer; and the protocol converter (75) is used to forward the serial signals received from the advanced memory buffer to the memory controller according to the parallel protocol of the memory controller. In one embodiment, the memory interface buffer (71) may temporary buffer the data received and the forward the received data using the proper protocol.

Figure 3:
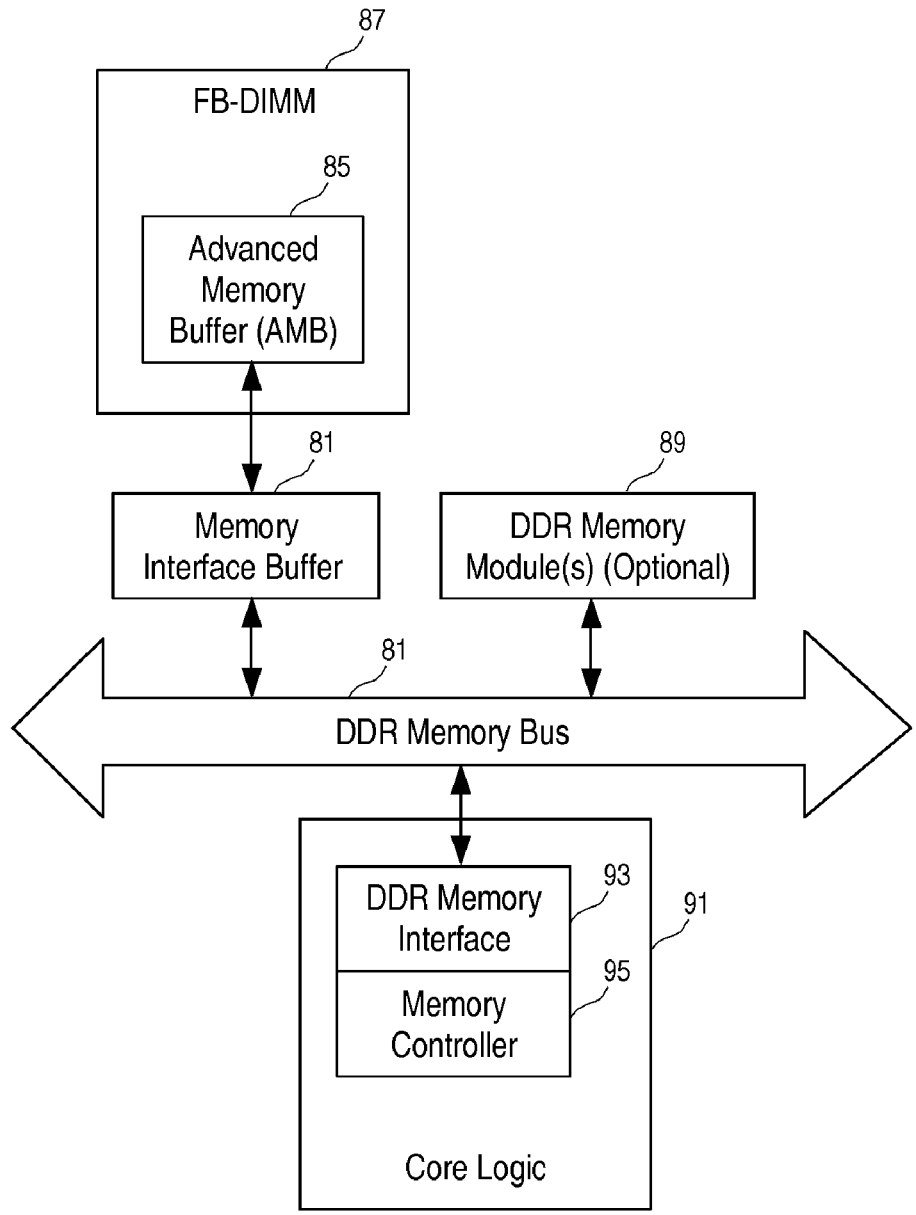
FIG. 3 shows a memory system architecture according to one embodiment of the invention.

FIG. 3 shows a memory system architecture according to one embodiment of the invention. In FIG. 3, a core logic chip (91) includes a memory controller (95) with a double data rate (DDR) memory interface (93) (or a quad data rate (QDR) memory interface, or other types of parallel memory interface). The memory interface of the memory controller is used to access memory via the memory bus (81), such as the DDR memory module(s) (89), which is optional.

In FIG. 3, a memory interface buffer (81) provides an interface for the memory controller (95) to access the FB-DIMM (87) with an advanced memory buffer (AMB) (85).

In one embodiment, the memory interface buffer (81) and the FB-DIMM (and any FB-DIMM chained after the FB-DIMM) can be viewed as a conventional memory module from the point of view of the memory controller. Thus, the memory interface buffer (81) shields the serial aspect of the FB-DIMM from the memory controller. The memory interface buffer (81) and the memory controller (95) may be viewed as a memory controller with an AMB interface. Thus, the memory interface buffer (81) shields the parallel memory bus aspect of the memory controller (95) from the FB-DIMM.

In one embodiment, one or more memory interface buffer can be connected to the memory bus, when needed. Thus, multiple chains of FB-DIMMs can be used on the memory bus.

Figure 4:
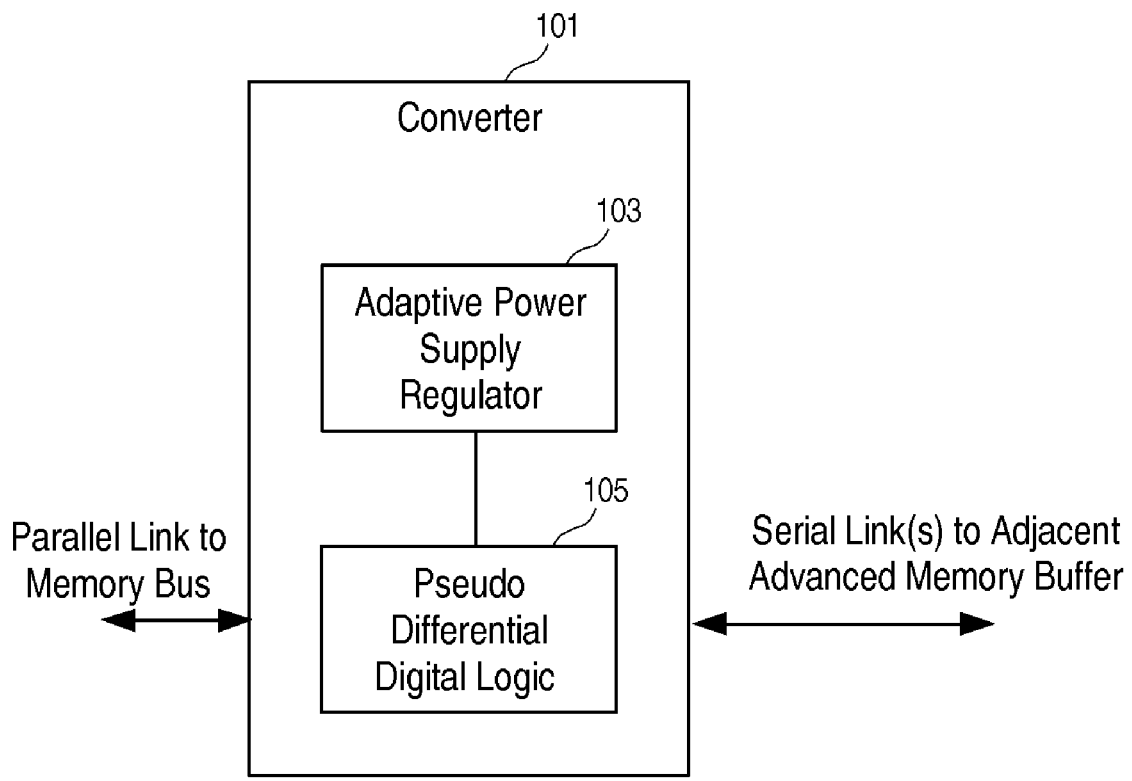
FIG. 4 shows a converter which can be used in a memory interface buffer according to one embodiment of the invention.

FIG. 4 shows a converter which can be used in a memory interface buffer according to one embodiment of the invention. In FIG. 4, a converter (101) includes pseudo differential digital logic (105) that is used to implement a receiver and an adaptive power supply regulator (103) that is coupled to the pseudo differential digital logic to adaptively adjust the voltage supply to reduce power consumption and improve power supply noise performance.

In one embodiment of the invention, the pseudo differential digital logic is used at least in the receiving portion of a memory interface buffer for the serial link(s) to the adjacent advanced memory buffer.

In embodiment of the invention seeks to use CMOS based pseudo differential logic to implement a high-speed data transceiver, which can be used in the memory interface buffer. In order to further reduce the power consumption of the transceiver, one embodiment of the invention further uses an adaptive power-supply regulator to adaptively adjust the power supply to the transceiver according to the working frequency, data transition pattern, fabrication process and working temperature variations.

When the feature size of an integrated circuit is 0.18 um or larger, the power supply requirement of CMOS transistors is relatively high while the operating frequency of CMOS transistors is relatively low, in comparison with MOS transistors that are used to implement CML circuit. Thus, in such integrated circuits, a data transceiver using CML circuits can actually operate in relative high speed due to CML's low output voltage swing. Meanwhile, CML also produces less power-supply noise since it generates less current spikes related to the use of a near constant power supply current.

However, with reduced channel length of CMOS transistors, for example, 0.13 um or beyond, CML loses its advantage over CMOS logic in speed because the transconductance of the MOS transistors increases only slightly and eventually saturates with channel length reduction. Although increasing the power of CML circuits considerably can increase the data transceiver's operating speed/frequency, such an approach can lead to the high power consumption of the transceiver. Thus, CML may not be suitable for use in high speed/frequency applications that requires lower power consumption.

CMOS digital logic is preferred when the feature size of CMOS is reduced to 0.13 um or smaller. However, traditional CMOS logic circuit technique has the disadvantage of generating rather large current spikes, thus, higher power-supply noises.

One embodiment of the invention implements CMOS pseudo differential logic circuits in the design of high-speed/frequency data transceivers, which increases the power-supply noises immunity of the transceiver while keeps the low-power advantage of CMOS logic circuits. CMOS logic circuits consume little power while not changing states; and the pseudo differential design of the logic circuit reduces the current spikes.

In one embodiment of the invention, an adaptive power-supply regulator is further used to reduce power consumption of the transceiver as well as to reduce the power-supply noises.

In one embodiment of the invention, the CMOS based transceiver is used for high speed data transportation, such as in the memory interface buffer, in which the data transmission speed can be above one Gigabit per second.

In one embodiment of the invention, a transceiver has substantially the same functional structure as the conventional transceiver, such as multiplexer, pre-driver, driver, data recovery, color recovery, de-multiplexer, etc.

However, in one embodiment of the invention, at least some of the MOS CML circuits used in the convectional transceiver are replaced with CMOS pseudo-different digital logic circuits. In one embodiment, the output driver is still implemented using the CML circuit due to system requirement. In one embodiment, only the output driver of the transceiver uses a MOS CML circuit.

Figure 5:
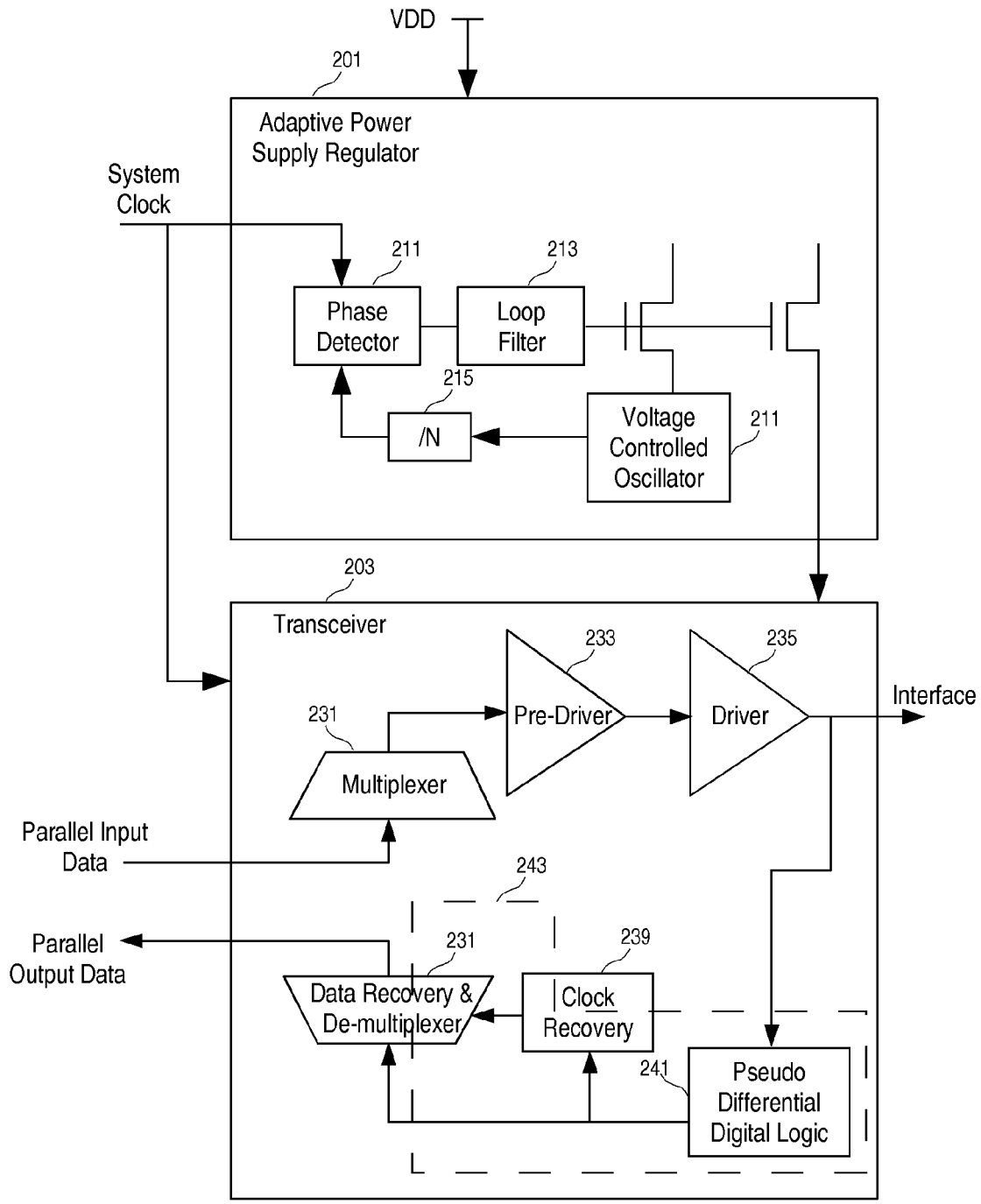
FIG. 5 shows a block diagram example of a transceiver which can be used in a memory interface buffer according to one embodiment of the invention.

FIG. 5 shows a block diagram example of a transceiver which can be used in a memory interface buffer according to one embodiment of the invention. In FIG. 5, the adaptive power supply regulator (201) provides the voltage supply to the transceiver (203), which includes a multiplexer (231) to receive parallel input data, a pre-driver (233), a driver (235) of the interface, a pseudo differential digital logic circuit (241) to receive from the interface, a clock recovery (239), and data recovery & de-multiplexer (237) to send out parallel output data.

In an alternative embodiment of the invention, the adaptive power supply regulator does not control the power supply of the drive (235).

The pseudo differential digital logic circuit (241) may cover more or less portion of the transceiver. For example, the pseudo differential digital logic circuit may be expanded to region (243) to implement a portion of the clock recovery (239) and a portion of data recovery & de-multiplexer (237). In one embodiment, the pseudo differential digital logic circuit may be further used in multiplexer (231) and/or the pre-driver (233).

Pseudo differential digital logic use two digital signal paths, which are complimentary, and a digital circuit (e.g., a latch) that is coupled in between the two digital signal paths to ensure that the output of the digital signal paths really have opposite polarity.

FIGS. 6-9 illustrate examples of a pseudo differential digital logic circuit which can be used in transceivers of memory interface buffers according to embodiments of the invention.

Figure 6:
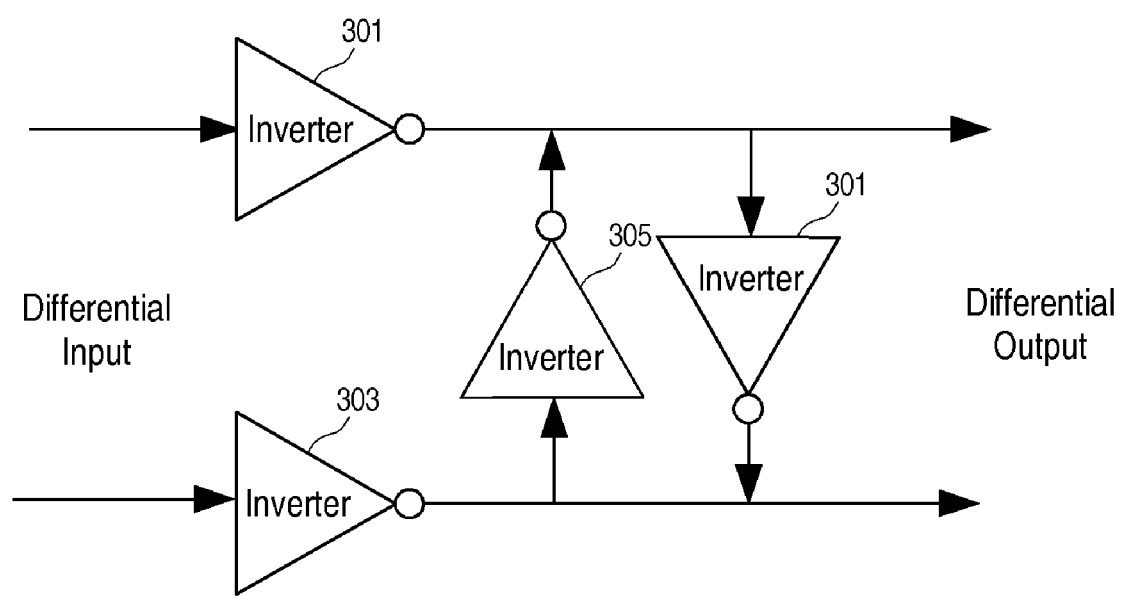
FIGS. 6-9 illustrate examples of a pseudo differential digital logic circuit which can be used in transceivers of memory interface buffers according to embodiments of the invention.

In FIG. 6, a differential input is converted into digital signals along two paths by inverters (301 and 303). Two inverters (305 and 307) bridges between the outputs of the inverters (301 and 303) in opposite directions to ensure that the output of the inverters (301 and 303) really have opposite polarity for the differential output.

Figure 7:
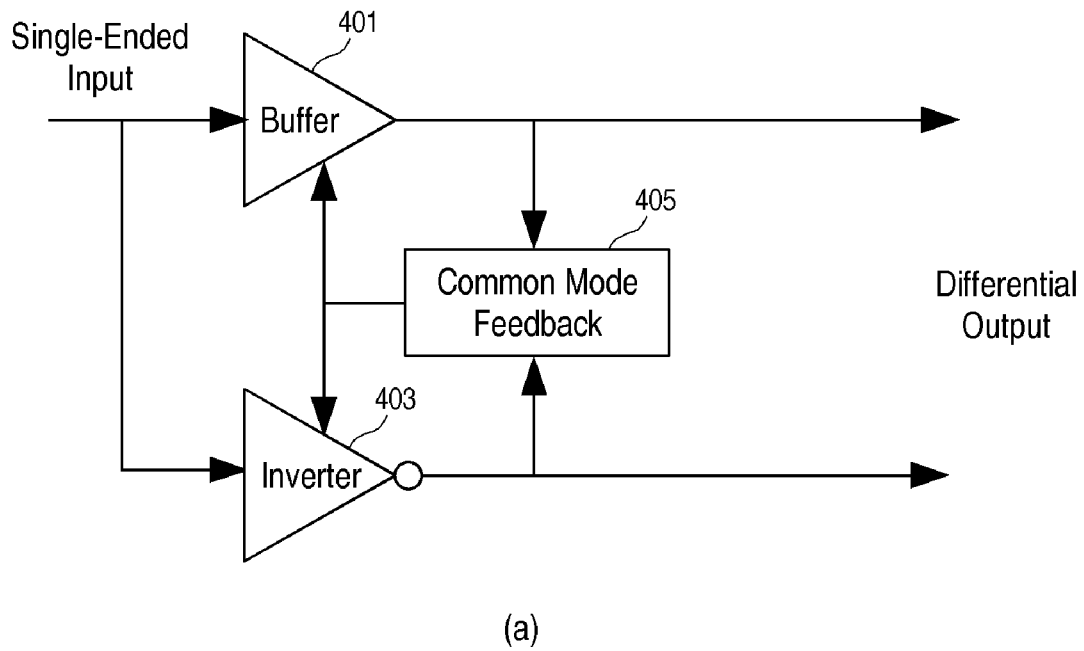
Figure 7:
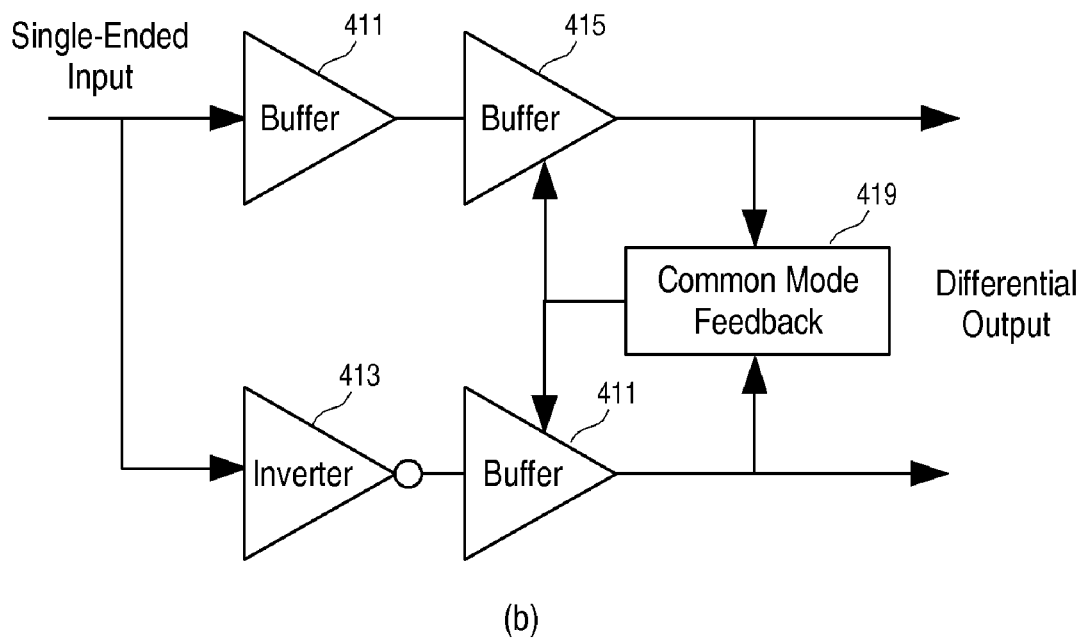

In FIG. 7(a), the pseudo differential digital logic includes a buffer (401) and an inverter (403) that converts a single-ended input into a pair of digital outputs along two paths. A common mode feedback logic block (405) is used to take the output of the buffer (401) and the output of the inverter (403), generate a feedback to the buffer (401) and the inverter (403) according to the common mode detected in the outputs and uses the feedback to adjust the buffer (401) and inverter (403) to reduce and/or eliminate the common mode, so that the differential output of opposite polarity is generated. The differential output can be further elevated in magnitude using a pair of buffers or inverters (not shown in FIG. 7) along the two paths.

In FIG. 7(b), the pseudo differential digital logic includes two buffers (411 and 415) to generate a digital output along one path and an inventor (413) and a buffer (417) to generate another digital output along another path. A common mode feedback (CMFB) logic block (419) is coupled to the output of the two path and the control of the buffers (415 and 417) to reduce and/or eliminate the common mode in a way similar as the common mode feedback (CMFB) logic block (405) in FIG. 7(a).

Alternatively, the CMFB block (419) may control the buffer (411) and the inverter (413) to minimize the common mode.

In FIG. 7(b), the buffer (417) follows the inverter (413) on the path. Alternatively, a buffer may be placed before an inverter on the path.

Figure 8:
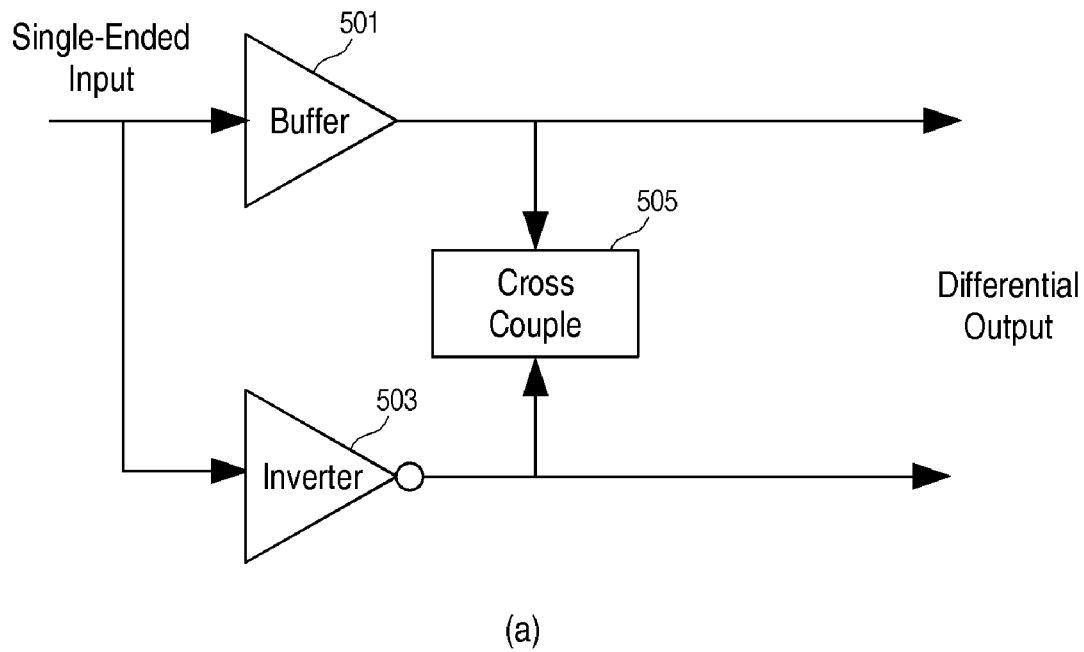
Figure 8:
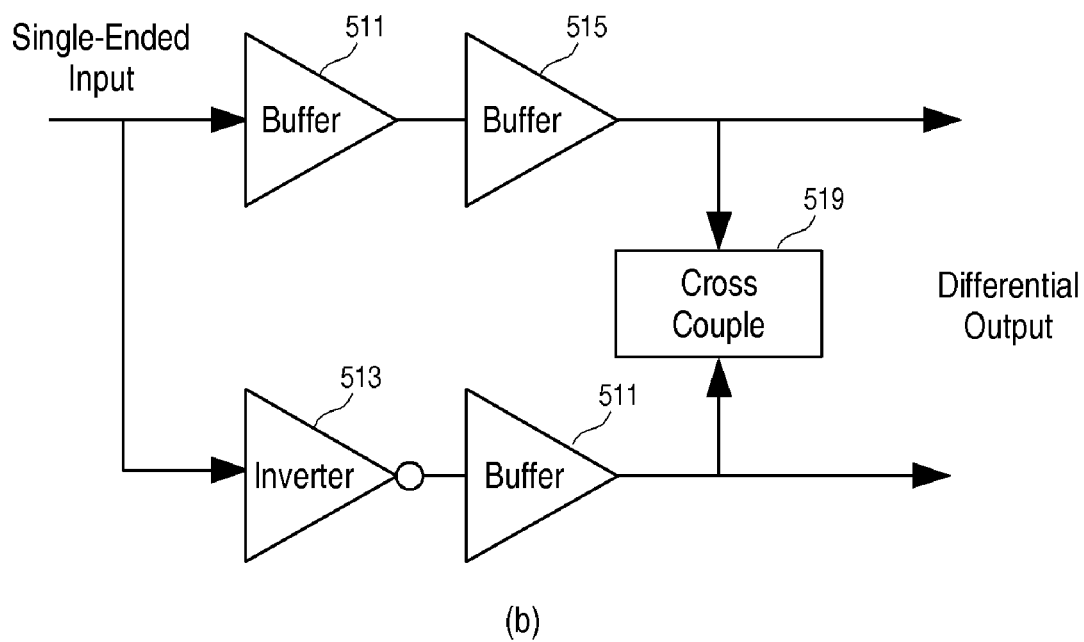

In FIG. 8(a), the pseudo differential digital logic includes a buffer (501) and an inverter (503) that converts a single-ended input into a pair of digital outputs along two paths. A cross-coupled logic block (505) is used to cross couple the output of the buffer (501) and the output of the inverter (503) so that the differential output of opposite polarity is generated. For example, the cross couple logic block (505) can be implemented using a pair of inverters connected in opposite direction, in a way as the inverters (305 and 307) in FIG. 3. The differential output can be further elevated in magnitude using a pair of buffers or inverters (not shown in FIG. 8) along the two paths.

In FIG. 8(b), the pseudo differential digital logic includes two buffers (511 and 515) to generate a digital output along one path and an inventor (513) and a buffer (517) to generate another digital output along another path. A cross couple logic block (519) is used to cross couple to the output of the two paths so that the outputs have opposite polarity in a way similar as the cross couple logic block (505) in FIG. 8(a).

In FIG. 8(b), the buffer (517) follows the inverter (513) on the path. Alternatively, a buffer may be placed before an inverter on the path.

Figure 9:
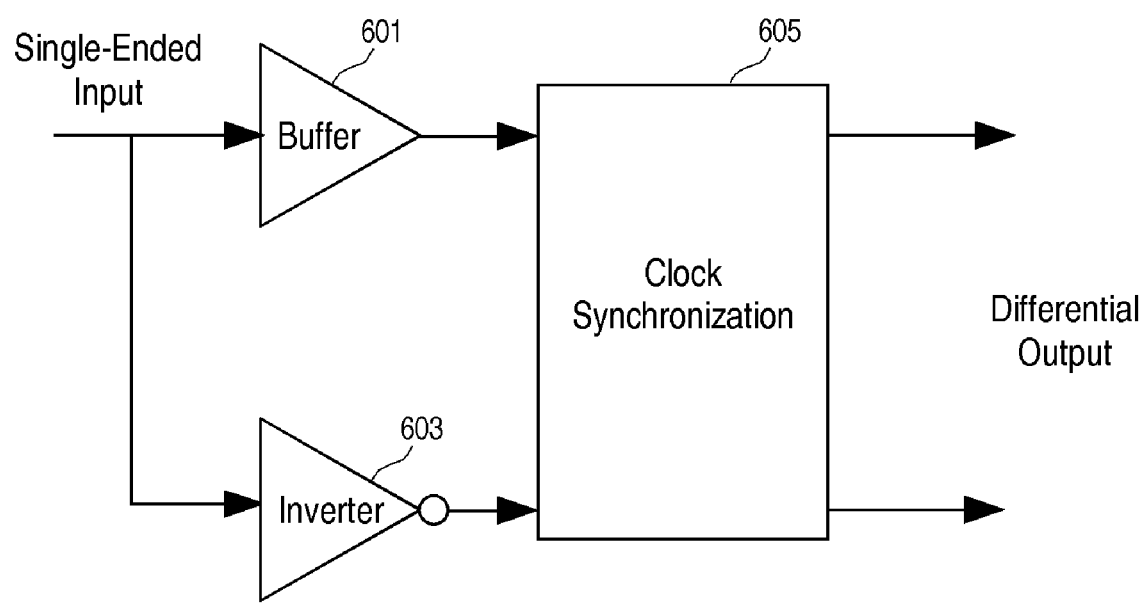

In FIG. 9, the pseudo differential digital logic includes two paths to generate two digital outputs and a clock synchronization logic block (605) is coupled between the two digital outputs to synchronize the clock of the digital outputs and generate the differential digital output. In one embodiment, the clock synchronization logic includes a phase detector and a voltage controlled oscillator (VCO). In one embodiment, the clock synchronization logic block (605) is used to recover clock from the input.

In FIG. 9, a buffer (610) and an inverter (603) are used along the two paths to generate the corresponding outputs that are the inputs to the clock synchronization circuit. Alternatively, a string of a combination of buffer(s) and/or inverter(s) can be used on each of the two paths to generate the differential output.

When the fabrication process scales down, the voltage supply of the transistors also comes down. The power consumption of CML circuit is proportional to VI, where V is the voltage supply and I is the operating (bias) current. The power consumption of CMOS PDL circuit is proportional to $CV^2f$, where C is the loading capacitance, V is the voltage supply, and f is the operating frequency.

Since the power consumption of CML circuit is a linear function of the voltage supply V while the power consumption of CMOS digital logic circuit is a square function of the voltage supply V, the power consumption of CMOS digital logic circuit scales down much faster than that of CML circuit as the voltage supply V scales down.

Thus, when advanced fabrication process (e.g., 0.13 micron or smaller) is used, for example, 0.13 um or beyond, a CMOS PDL circuit consumes less power than a CML circuit.

Further more, the power consumption of a CML circuit is a function of voltage supply V and operating current 1, but not a function of the operating frequency f. Thus, the power consumption of a CML circuit is independent of the nominal frequency of the signal and the data transfer pattern. Thus, a CML circuitry is typically designed to maintain full power and run at the highest possible frequency of the system for the data transfer performance.

On the other hand, the power consumption of the CMOS PDL circuit is proportional to the operating frequency f. When the operating frequency f is low, the circuitry consumes less power. In applications such as AMB where no special coding (8B/10B) is used to maintain high transition rate and DC balance, it is highly possible that there is no transition for a long period of time in which the working frequency f is 0. Since the working frequency f changes from time to time, a CMOS PDL based circuit may consume less low power statistically.

In one embodiment of the invention, an adaptive power-supply regulator is used to further reduce the power consumption of the transceiver. The power-supply regulator adaptively adjusts the power supply of the transceiver according to the working frequency, data transition pattern, fabrication process and working temperature variations.

The adaptive power-supply regulator not only reduces power consumption of the transceiver but also functions as a power-supply filter to reduce the power-supply noises.

In one embodiment, the adaptive power-supply regulator includes a Phase-Locked Loop (PLL) and a bias generator. The Phase-Locked Loop includes a phase detector (PD) (211), a loop filter (LF) (213), a voltage controlled oscillator (VCO) (217) and a frequency divider (215).

In one embodiment, the VCO of the Phase-Locked Loop (PLL) of the adaptive power-supply regulator is the same as the VCO of the clock recovery of the transceiver. In one embodiment, the VCO is implemented using CMOS logic circuits. In one embodiment, the adaptive power-supply regulator and the transceiver share the same VCO.

In one embodiment, the working frequency of the VCO in the adaptive power-supply regulator is designed to track the working frequency of the transceiver logic circuits (e.g., the highest working frequency) to optimize the power supply of the transceiver so that no extra power is wasted. Thus, the transceiver uses less power than a corresponding CML implementation.

Alternatively, Phase-Locked Loop (PLL) in the adaptive power-supply regulator can be replaced with a Delay Locked Loop (DLL).

The adaptive power-supply regulator may use a design known in the field. For example, an adaptive power-supply regulator described by J. Kim and M. A. Horowitz in "Adaptive supply serial links with sub-1V operation and per-pin clock recovery, IEEE International Solid-State Circuits Conference, vol. XLV, pp. 268-269, February 2002, can be used with embodiments of the invention.

A current mode logic (CML) costs more die area than digital logic but has better noise performance. Digital logic can achieve similar speed performance in deep-sub micron process. The power consumption of a digital logic is data pattern dependent, such that it consumes almost any power if there is no data activity. The current mode logic uses the same power regardless whether there is data activity or not. A general digital logic has bad noise performance. At least one embodiment of the invention uses the pseudo-differential design and the regulated power supply to improve the noise performance.

Figure 10:
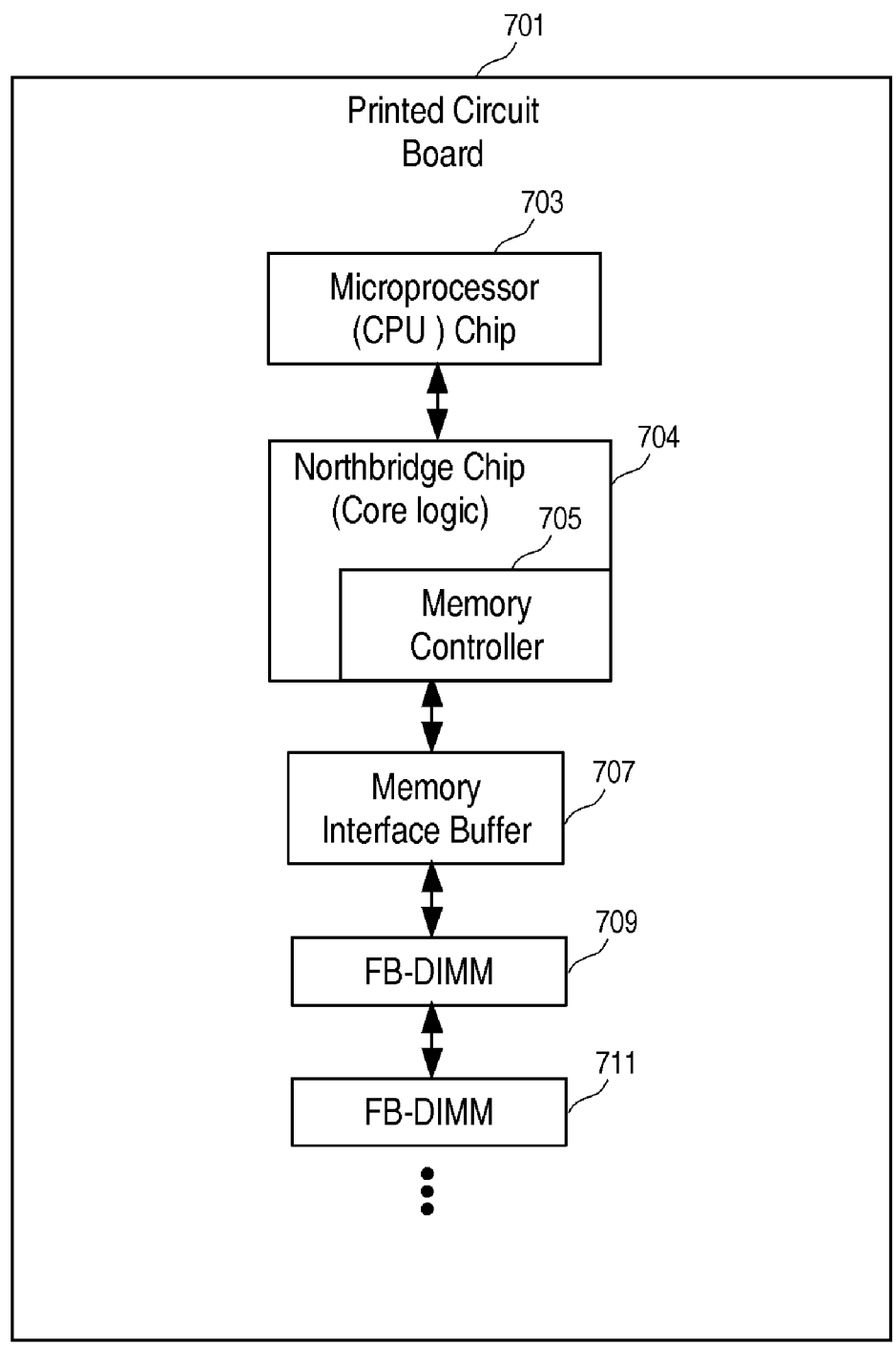
FIGS. 10-11 illustrate examples of printed circuit boards according to embodiments of the invention.
Figure 11:
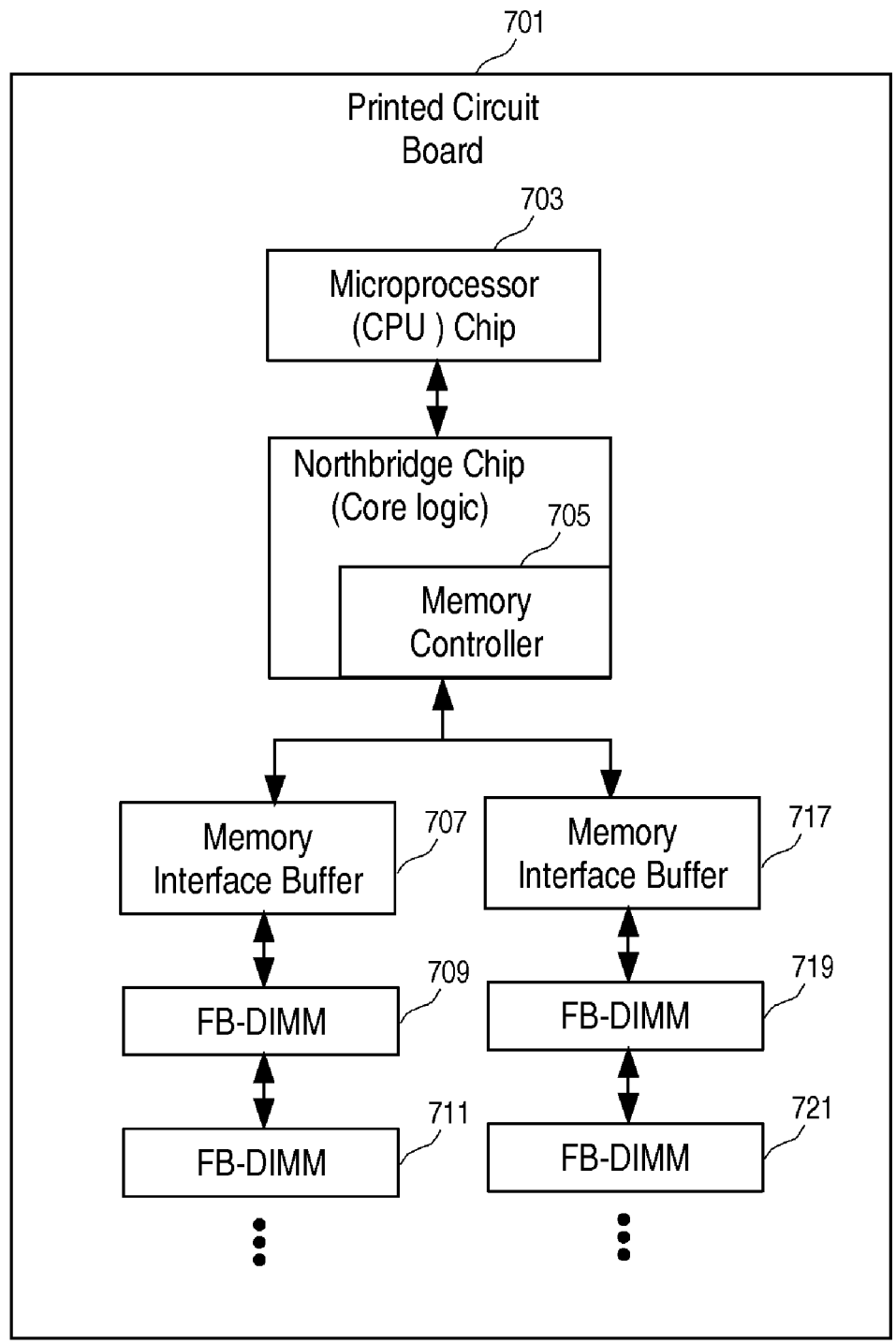

FIGS. 10-11 illustrate examples of printed circuit boards according to embodiments of the invention.

In FIG. 10, a printed circuit board (701) includes a microprocessor (CPU) chip (703) (or a socket for the microprocessor) and traces to connect the microprocessor chip (703) to the northbridge chip (704), which is typically one of a chipset for the system core logic. The northbridge chip (704) contains the memory controller (705), which is connected to the memory interface buffer (707) and further connected to FB-DIMMs (e.g., 709, 711, etc.)

In one embodiment, the memory interface buffer (707) is installed directly on the printed circuit board (701). Alternatively, the memory interface buffer (707) is installed on a module that has a form factor of a conventional memory module (e.g., an un-buffered or registered DIMMs), which can be inserted into the memory sockets for the conventional memory modules.

In FIG. 10, the FB-DIMMs may be connected to the memory interface buffer (707) via traces on the printed circuit board (701) (e.g., when the memory interface buffer is mounted directly on the printed circuit board), or be connected to the memory interface buffer (707) through serial cables. Multiple FB-DIMMs may be integrated in one unit, with a serial connection to the memory interface buffer (707).

In FIG. 11, multiple memory interface buffers (e.g., 707 and 717) can be coupled to the memory controller (705). For example, when needed, a module containing the memory interface buffer (e.g., 707 or 717) can be installed on the printed circuit board (701) to allow the system to add more FB-DIMMs. Alternatively, one may decide to use conventional unbuffered or registered DIMMs in these sockets.

Further, in one embodiment, a memory interface buffer chip may include multiple interfaces to AMBs, such that multiple chains of FB-DIMMs may be connected to a memory interface buffer.

Further, in one embodiment, a module containing the memory interface buffer and suitable for insertion into the conventional memory sockets may also contain an AMB and memory chips, such that the memory interface and one FB-DIMM are integrated on one module insertable in a conventional memory socket for a parallel memory bus. Once such a module is inserted in the motherboard, further FB-DIMM can be chained after the AMB of the module.

Further, in one embodiment, a module containing the memory interface buffer may include multiple interfaces to AMBs, such that multiple chains of FB-DIMMs may be connected to a module.

In one embodiment, the memory interface buffer is designed to be capable to communicate with Advanced Memory Buffer (AMB) according to a Joint Electron Device Engineering Council (JEDEC) specification.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A printed circuit board, comprising:
at least one memory interface buffer chip to connect a memory controller of core logic and an advanced memory buffer (AMB), the memory interface buffer chip being separate from the memory controller on the printed circuit board.

2. The printed circuit board of claim 1, further comprising:
a plurality of memory sockets configured to accept one or more fully buffered memory modules;
a chipset comprising the memory controller; and
a central processing unit (CPU) socket coupled to the chipset to accept a microprocessor chip.

3. The printed circuit board of claim 1, further comprising:
an advanced memory buffer (AMB) and a plurality of memory chips under the control of the advanced memory buffer.

4. The printed circuit board of claim 1, wherein the printed circuit board has a form factor suitable for insertion into a memory socket on a motherboard.

5. A computer system, comprising:
a microprocessor chip;
a core logic chip coupled to the microprocessor chip, the core logic chip comprising a memory controller having a memory interface;
one or more fully buffered dual in-line memory modules; and
a memory interface buffer chip coupled between the memory interface of the memory controller and the one or more fully buffered dual in-line memory modules.

6. The computer system of claim 5, further comprising:
a printed circuit board;
wherein the microprocessor chip, the core logic chip, the one or more fully buffered dual in-line memory modules and the memory buffer chip are mounted on the printed circuit board.

7. The computer system of claim 5, wherein the memory interface buffer chip is coupled to the memory interface of the memory controller via a bus; and the memory interface buffer chip is not an Advanced Memory Buffer (AMB) of a fully buffered dual in-line memory module.

8. A computer system, comprising:
a microprocessor chip;
a core logic chip coupled to the microprocessor chip, the core logic chip comprising a memory controller;
one or more fully buffered dual in-line memory modules; and
a memory interface buffer chip coupled between the memory controller and the one or more fully buffered dual in-line memory modules, wherein the memory controller accesses memory via a parallel memory bus.

9. The computer system of claim 8, further comprising:
one or more further buffered dual in-line memory modules; and
a further memory buffer chip coupled between the memory controller and the one or more further fully buffered dual in-line memory modules.

10. A circuit, comprising:
a transceiver to bridge a parallel memory bus and a serial memory bus; and
a protocol converter coupled to the transceiver to translate control signals received from a memory controller of the parallel memory bus to control signals for the serial memory bus.

11. The circuit of claim 10, wherein the circuit is implemented on a single integrated circuit chip.

12. The circuit of claim 10, wherein the serial memory bus is connected to an Advanced Memory Buffer (AMB) of a fully buffered dual in-line memory module.

13. The circuit of claim 12, wherein the parallel memory bus is connected to a memory controller of core logic on a motherboard.

14. The circuit of claim 12, wherein the parallel memory bus is connected to a memory controller of a northbridge chip.

15. The circuit of claim 10, wherein the transceiver comprises:
a pseudo differential digital logic circuit to convert an input to the transceiver into a differential digital output.

16. The circuit of claim 15, wherein the pseudo differential digital logic circuit is implemented using Complementary Metal-Oxide Semiconductor (CMOS).

17. The circuit of claim 16, further comprising:
an adaptive power-supply regulator coupled with the pseudo differential digital logic circuit to adaptively adjust a power supply of the pseudo differential digital logic circuit.

18. The circuit of claim 16, wherein the pseudo differential digital logic circuit comprises:
two logic units each of which is one of: a buffer and an inverter; and
a common mode feedback (CMFB) circuit coupled to the two logic units, the CMFB circuit to receive outputs of the two logic units and adjust the two logic units according to a common mode detected from the outputs of the two logic units to suppress command mode.

19. The circuit of claim 16, wherein the pseudo differential digital logic circuit comprises:
two logic units each of which is one of: a buffer and an inverter; and
a cross couple circuit coupled to the two logic units, the cross couple circuit to cross couple outputs of the two logic units to suppress command mode in the outputs of the two logic units.

20. The circuit of claim 16, wherein the pseudo differential digital logic circuit comprises:
two logic units each of which is one of: a buffer and an inverter; and
a clock synchronization circuit coupled to the two logic units to synchronize timing of outputs of the two logic units.

* * * * *